United States Patent [19]

Cutright

[11] Patent Number: 5,250,752
[45] Date of Patent: Oct. 5, 1993

[54] KNOCKDOWN EMI/RFI SHIELDED ELECTRONIC RACK ENCLOSURE

[75] Inventor: David F. Cutright, York, Pa.

[73] Assignee: Gamlet Incorporated, York, Pa.

[21] Appl. No.: 980,625

[22] Filed: Nov. 23, 1992

[51] Int. Cl.[5] ............................................. H05K 9/00
[52] U.S. Cl. .................................. 174/35 R; 361/818;
174/35 MS; 312/263; 312/265.4
[58] Field of Search ...................... 174/35 R; 361/424;
312/263, 140, 265.1–265.6; 403/403, 110

[56] References Cited

U.S. PATENT DOCUMENTS

| | | | |
|---|---|---|---|
| 3,297,383 | 1/1967 | Fay | 312/265.4 |
| 3,854,268 | 12/1974 | Gunter | 403/403 |
| 4,006,949 | 2/1977 | Keller . | |
| 4,812,075 | 3/1989 | Lavin, Sr. . | |
| 4,836,626 | 6/1989 | Taylor et al. . | |
| 5,004,107 | 4/1991 | Sevier et al. . | |
| 5,090,833 | 2/1992 | Dertle | 403/373 |
| 5,194,691 | 3/1993 | McIlwraith | 174/35 GC |

Primary Examiner—Leo P. Picard
Assistant Examiner—Geoffrey A. Cumbus
Attorney, Agent, or Firm—Samuel M. Learned, Jr.

[57] ABSTRACT

An easily assembled and dis-assembled knockdown EMI/RFI shielded electronic rack enclosure incorporating the structurally cooperative use of squaring bracket assemblies for the squared unitized corner joining of adjacent vertical side wall frame to horizontal top and bottom frame components and thereby substantially eliminate the distortion effects of racking forces, as well as the use of joining clamps for the unitized assembly connection of top and bottom enclosement panel components respectively to the opposing side enclosement panel components and thereby additionally substantially eliminate EMI/RFI shielding leaks resultant from mechanical shock forces.

12 Claims, 3 Drawing Sheets

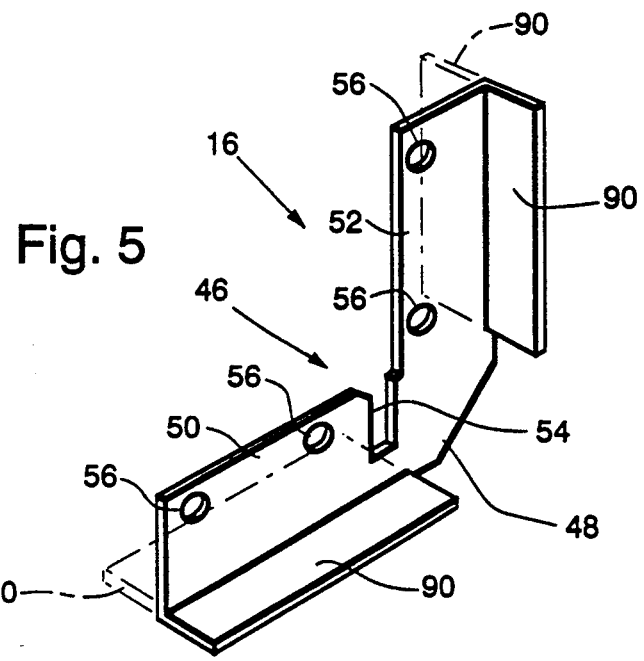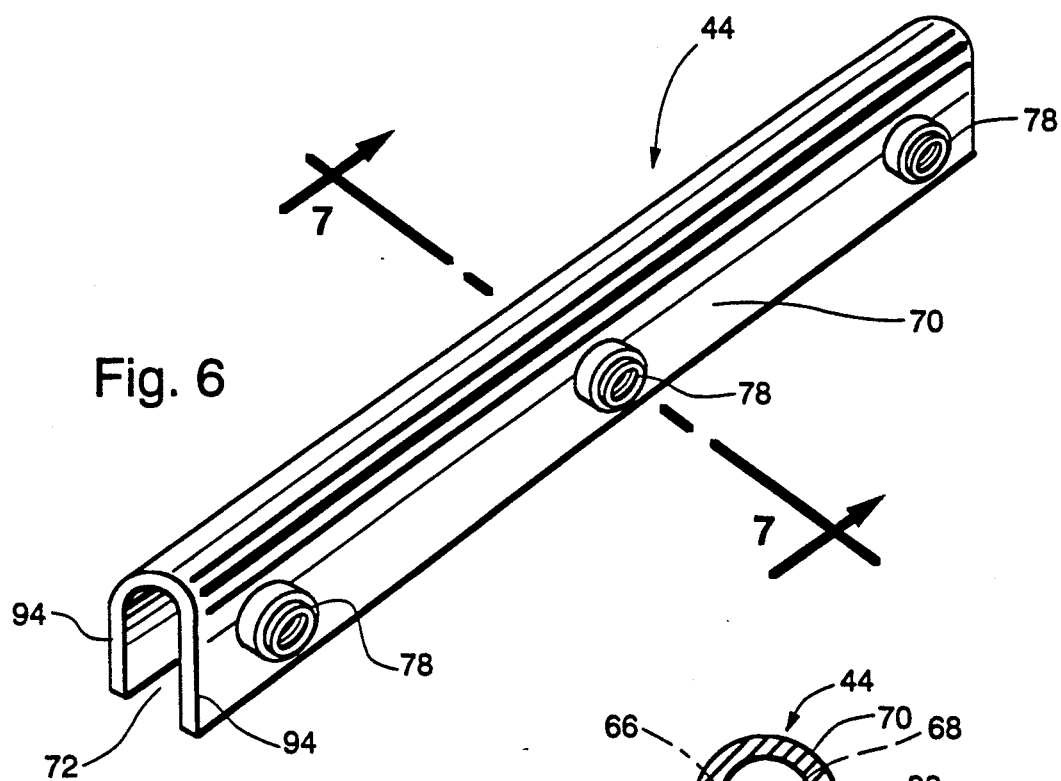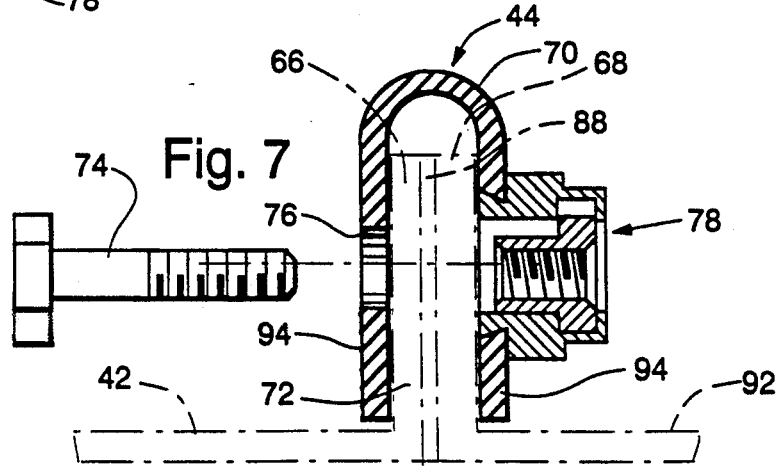

KNOCKDOWN EMI/RFI SHIELDED ELECTRONIC RACK ENCLOSURE

BACKGROUND OF THE INVENTION

The present invention relates to a shielded cabinet within which to install and protectively house electronic equipment in order to prevent the receiving as well as broadcast of electromagnetic interference (commonly known and hereinafter referred to as EMI) and radio frequency interference (commonly known and hereinafter referred to as RFI), which type of cabinet is generally called an EMI/RFI shielded electronic rack enclosure, but as in this case since also having disassembly and portability features being further denomenated as a knockdown enclosure.

The particular knockdown EMI/RFI shielded electronic rack enclosure subject of the instant invention is specifically adapted for use employment aboard naval vessels since in the knocked-down transport state it can be easily moved through relatively small hatches and passageways with facility, and in the erected and installed state can withstand racking forces due to vessel motion and the resultant twisting torques, as well as mechanical shock forces due to impact and vibration, all of which are commonly encountered in naval vessel use environments.

In order to maintain the EMI and RFI shielding efficiency of any particular electronic equipment enclosure cabinet it is necessary that the structural integrity thereof be maintained when subjected to the force environment within which it is erected and installed. This is particularly true in the case of knockdown enclosures since by the very nature of their portability features they are normally lighter in weight and less rigid in construction. Exemplary of typical knockdown electronic enclosure cabinets such as those above described would be as respectively taught by Keller in U.S. Pat. No. 4,006,949 dated Feb. 8, 1977, and Taylor et al in U.S. Pat. No. 4,836,626 dated Jun. 6, 1989.

One way to enhance the rigidity and force resistant features of an electronic cabinet or rack enclosure structure is to provide reinforced corner squaring and connection means for the support frame thereof, exemplary of which would be those such as respectively taught by Fay in U.S. Pat. No. 3,297,383 dated Jan. 10, 1967, Lavin, Sr., in U.S. Pat. No. 4,812,075 dated Mar. 14, 1989, or Sevier et al in U.S. Pat. No. 5,004,107 dated Apr. 2, 1991. Further, if the cabinet enclosement panels are connected either to or upon the support frame structure in such a way as to integrally enhance the structural strength and rigidity thereof, then the EMI/RFI shielding features are more likely to be maintained during employment in rigorous use environments. In the immediate foregoing regard the invention hereof also adapts use of an elongated U-shaped joining clamp for accomplishing such purpose.

Thus, through the structural combination taught by the instant invention there is provided a knockdown EMI/RFI shielded electronic rack enclosure which is both force resistant and highly efficient and reliable in maintaining its EMI/RFI shielding characteristics, particularly in naval vessel use environments.

SUMMARY OF THE INVENTION

It is the principal object of the present invention to provide a knockdown EMI/RFI shielded electronic rack enclosure having an optimal degree of operational installation flexibility and a structure characterized by both high strength and mechanical rigidity.

It is another object of the present invention to provide a knockdown EMI/RFI shielded electronic rack enclosure which embodies the use of a novel squaring bracket assembly for the corner joining of adjacent side wall frame to top and bottom frame components with the resultant structural integrity of a unitized construction, thereby substantially eliminating deleterious consequences to EMI/RFI shielding efficiency resultant from the motion and flexing distortion effects of racking forces.

It is yet another object of the present invention to provide a knockdown EMI/RFI shielded electronic rack enclosure which embodies the use of said squaring bracket assembly whereby the rack enclosure support structure corner junctions when fit and assembled therewith will be joined so that all of the sides and support surfaces thereof are erected square and true.

It is also an object of the present invention to provide a knockdown EMI/RFI shielded electronic rack enclosure incorporating the use of a novel joining clamp for the assembly connection of top and bottom panel components respectively to the opposing side panel components likewise with the structural integrity of a unitized construction, thereby substantially eliminating deleterious effects to EMI/RFI shielding efficiency resultant from the mechanical shock forces of impact and vibration.

A further object of the present invention is to provide a knockdown EMI/RFI shielded electronic rack enclosure which exhibits improved EMI/RFI shielding by utilizing a frame and panel juncture and joint self-adhering EMI/RFI insulation upon all connecting surfaces during the installation assembly thereof.

Yet another object of the present invention is to provide a knockdown EMI/RFI shielded electronic rack enclosure which is assembled with self-locking fasteners to thereby maintain a unitized structural integrity once the bracket and clamp components are assembled and joined.

It is also an object of the present invention to provide a knockdown EMI/RFI shielded electronic rack enclosure that is designed for ease and convenience of movement in the disassembled state through small hatches and in narrow passageways, specifically for use and installation aboard naval ships and submarines.

An additional object of the present invention is to provide a knockdown EMI/RFI shielded electronic rack enclosure that is able to be quickly and efficiently assembled and dis-assembled by unskilled labor with a minimum of tools.

The foregoing, and other objects hereof, will be readily evident upon a study of the following specification and accompanying drawings comprising a part thereof.

BRIEF DESCRIPTION OF THE DRAWINGS

FIG. 5 is a perspective elevation view of a squaring bracket assembly as previously illustrated in FIG. 1, showing in phantom lines flanges formed on the opposite side thereof for use on opposing corners in assembly of the knockdown rack enclosure hereof.

FIG. 6 is an enlarged perspective view of the joining clamp as previously illustrated in FIG. 1.

FIG. 7 is an enlarged sectional elevation view of the joining clamp as shown in FIG. 6 and taken along the line 7—7 thereof, also therein illustrating a threaded fastener and in phantom the rack enclosure components to be joined thereby.

DETAILED DESCRIPTION OF THE INVENTION

Figure 1:
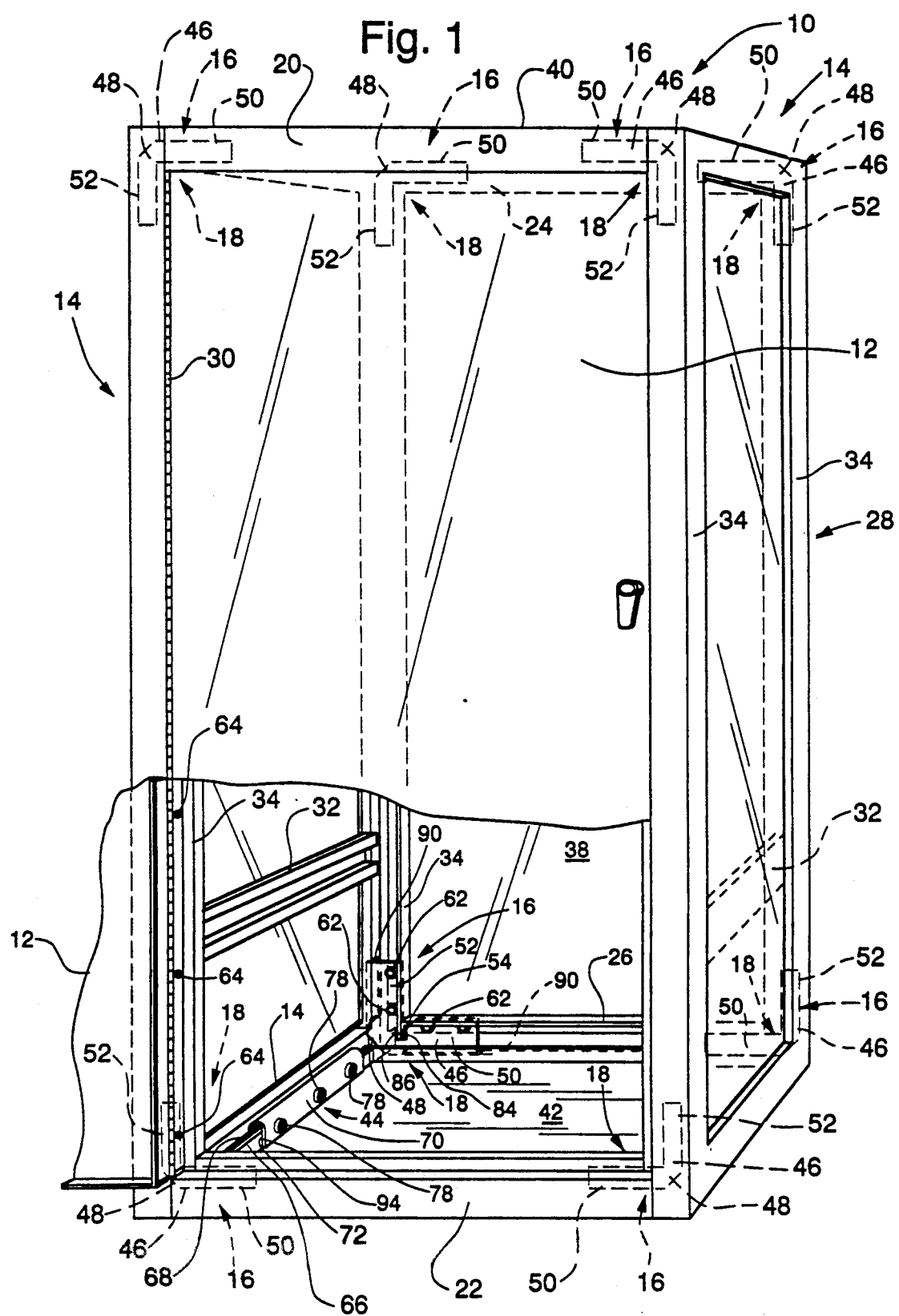
FIG. 1 is a front perspective view of the knockdown EMI/RFI shielded electronic rack enclosure hereof, in the erected and installed state, with the door thereof broken away at the bottom and shown in open position to more clearly reveal cooperative installation and use respectively of the squaring bracket and joining clamp assemblies as employed in the erected knockdown rack enclosure construction.

Referring to FIG. 1, the knockdown EMI/RFI shielded electronic rack enclosure 10 of present invention and component parts comprising the same are shown assembled in an erected and installed state in a front perspective view thereof with the door 12 being broken away in an open position at the bottom to more clearly reveal various assembly features, wherein the component parts consist of a spaced set of rectangular frame members 14 disengageably interconnected by means of squaring bracket assemblies 16 respectively at each of the corner junctures 18 thereof with an upper and lower front horizontal frame member 20 and 22 and an upper and lower rear horizontal frame member 24 and 26 to thereby form a properly squared and mechanically rigid free-standing three dimensional support structure 28 upon which to assemble said door 12 by means of a piano hinge 30 as well as equipment rack support beams 32 between the vertical frame sections 34, and upon which to likewise disengageably connect opposing side wall enclosement panels 36, a rear enclosement panel 38, and top and bottom enclosement panels 40 and 42 respectively by means of joining clamps 44.

Before explaining in greater detail the disengageable assembly aspects of the knockdown EMI/RFI shielded electronic rack enclosure 10, consideration will first be directed to identification of the various knockdown component parts thereof for assembly from the knocked-down and transport to the erected and installed state. The set of rectangular frame members 14 are individual knockdown components as are the horizontal frame members 20, 22, 24, and 26. The door 12 and rear enclosement panel 38, the side wall enclosement panels 36, the top and bottom enclosement panels 40 and 42, and equipment rack support beams 32, are all also individual knockdown components. In addition, the individual squaring bracket assemblies 16 and joining clamps 44 respectively with assembly connector means therefor are collectively likewise knockdown components by which the foregoing individual components are disengageably joined in interlocked assembly to form an erected and installed knockdown EMI/RFI shielded electronic rack enclosure 10, or removed to disassemble the same to the knocked-down and transport state, wherein the view of said rack 10 as illustrated in FIG. 1 is of the same in an erected and installed state.

Referring again to FIG. 1 to consider in greater detail both the structural and cooperative disengageable mechanical connection aspects of both the squaring bracket assembly 16 and the joining clamp 44, and considering first those of the squaring bracket assembly 16.

As shown in FIG. 1, the squaring bracket assembly 16 is structurally comprised of an L-shaped bracket body 46 having unitized construction with a set of flanged legs joined one to the other at a 90-degree angle by means of an angled interconnecting web segment 48 so that the bracket body 46 provides a horizontal flanged leg 50 for disengageable mechanical assembly interconnection thereof with a horizontal frame member 20, 22, 24 or 26 as the case may be disengageably to a cooperatively corresponding vertical frame section 34 of one of the opposingly spaced sets of rectangular frame members 14 by means of a vertical flanged leg 52. It will be noted that the angled interconnecting web segment 48 is provided along the face of the interior leg connecting angle thereof with a rectangular shaped slot 54 provided within the horizontal flanged leg 50, which slot 54 is adapted to receive and support projections of the respective rectangular and horizontal frame members thereby to positively fix the same disengageably all as will be more fully explained upon a detailed consideration of certain subsequent Figures hereinafter. As will also be shown and more fully explained hereinafter, each flanged leg 50 and 52 is provided with flange leg connector openings 56 which when aligned with corresponding rectangular and horizontal frame connector openings 58 and 60 enable the disengageable mechanical interconnection assembly respectively thereof by means of nut and bolt connectors 62. It is the mechanically cooperative interior structural interlocked assembly of the respective squaring brackets 16 with the horizontal 20, 22, 24 and 26 frame sections to the respective structurally complementary vertical frame sections 34, at the corner junctures 18 which comprises the first knockdown EMI/RFI shielded electronic rack erection step, to thereby provide the mechanically rigid free-standing three dimensional support structure 28 for assembly of the door 12 and various panel components 36, 38, 40 and 42 thereto, and which further provides the structural integrity to withstand the motion and flexing distortion effects of racking forces.

The next knockdown EMI/RFI shielded electronic rack enclosure erection step is to assemble and install the various panel components 36, 40 and 42 thereto, which is accomplished by means and use of joining clamps 44, and the door 12 with weldably pre-installed piano hinge 30 which is assembled to the complementary rectangular frame member 14 vertical frame section 34 by means of screws 64 as well as is the rear enclosement panel 38.

As also shown in FIG. 1, and as will be more fully explained on detailed consideration of certain subsequent Figures hereinafter, the joining clamp 44 is employed to connectably and compressively assemble panel flanges 66 of the top and bottom enclosement panels 40 and 42 to correspondingly complementary panel flanges 68 of the side wall enclosement panels 36, and thereby provide the structural integrity to maintain EMI/RFI shielding efficiency notwithstanding the otherwise deleterious effects thereto resultant from the mechanical shock forces of impact and vibration.

The joining clamp 44 is structurally comprised of an elongated U-shaped body 70 that is adapted to receive within the clamp opening 72 thereof and in close complementary communication therewith for compressive clamping thereby a top or bottom panel flange 66 and a corresponding side wall panel flange 68. The compressive clamping means therefor is provided by a plurality of threaded connectors 74 inserted through complementary openings 76 in both the joining clamp 44 and the respective panel flanges 66 and 68 for threadable engagement with self-locking nut assemblies 78.

The knockdown EMI/RFI shielded electronic rack enclosure 10 and sub-assembly component parts thereof such as the squaring bracket assembly 16 and joining clamps 44, as well as other parts as shown and illustrated in FIG. 1, and certain subsequent Figures hereinafter, may be fabricated by accepted manufacturing methods and techniques from various metals and alloys thereof, or plastics, or combinations of metals, metal alloys, and plastics.

Figure 2:
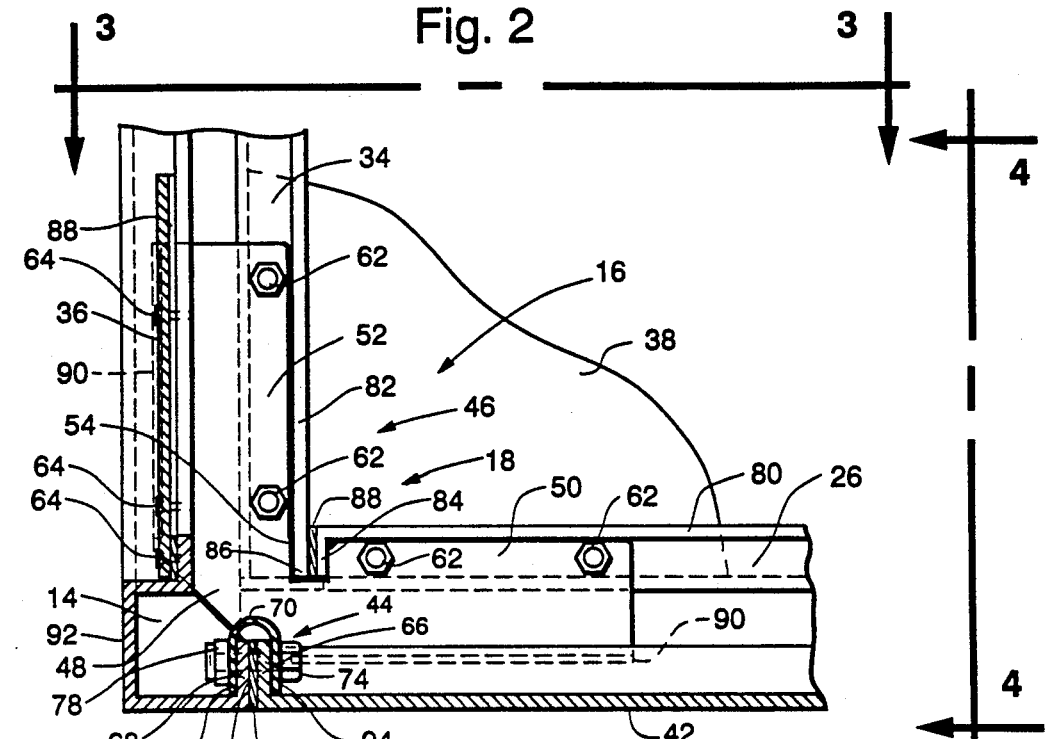
FIG. 2 is an enlarged fragmentary elevation view of the squaring bracket assembly as visibly shown installed in FIG. 1 and seen along the line 2—2 of FIG. 3.
Figure 3:
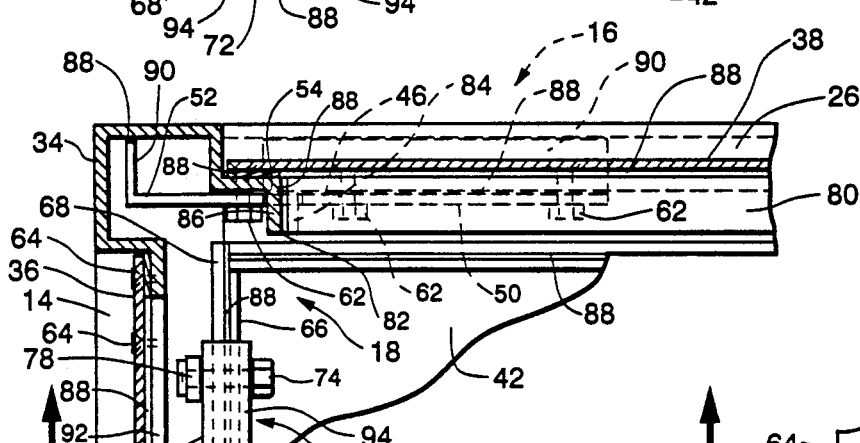
FIG. 3 is a top plan view of the squaring bracket assembly installation as shown in FIG. 2 and taken along the line 3—3 thereof.
Figure 4:
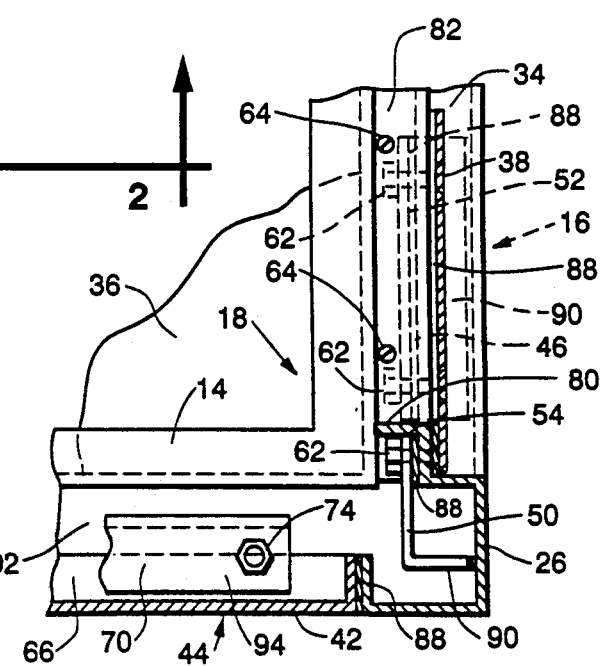
FIG. 4 is a side elevation view of the squaring bracket assembly installation as shown in FIG. 2 and taken along the line 4—4 thereof.

Referring now to the enlarged fragmentary elevation view of the squaring bracket assembly 16 installation as shown in FIG. 2, which also provides greater detail of the joining clamp 44 installation. Considering first, however, the cooperative mechanical features of the squaring bracket assembly 16 in providing a unitized construction when employed to connect a horizontal frame member, as in this illustrative example the lower rear horizontal frame member 26, with a vertical frame section 34. It will be noted that the squaring bracket assembly 16 is dimensionally adapted to provide a close complementary fit cooperatively within the channel structures of both the horizontal frame member 26 and that of the vertical frame section 34 by contact communication thereof with channel flanges 80 and 82 respectively of the horizontal frame member 26 and the vertical frame section 34 in turn with the leading interior edges of the horizontal flanged leg 50 and the vertical flanged leg 52 of said squaring bracket assembly 16. Additionally, the rectangular shaped slot 54 of said squaring bracket assembly 16 is adapted to receive in close complementary cooperative mechanical communication therewithin a horizontal frame member channel flange leg 84 and a vertical frame section channel flange leg 86 with an interposed strip of self-adhering EMI/RFI insulation 88 therebetween, which provides an additional and structurally cooperative unitized construction connection feature when assembling the mechanically rigid free-standing three dimensional support structure 28 of said knockdown rack 10. Next, each of the squaring bracket assembly 16 flanged legs 50 and 52 are respectively provided with a frame contact stabilizing flange 90, best shown in FIG. 5, but which in assembly installation as shown in FIGS. 2 through 4 cooperatively contacts the complementary frame component 26 and 34 to in turn thereby effect a mechanical stabilizing of the unitized connection assembly achieved by use of the squaring bracket assembly 16. Lastly, all of the cooperative unitized construction connection and stabilizing features obtained through use of said squaring bracket assembly 16 as above described are fixed by locked interconnection thereof with said frame components 26 and 34 by means of nut and bolt connectors 62, resulting in a knockdown rack mechanically rigid support structure 28 which substantially eliminates EMI/RFI shielding efficiency compromises otherwise consequent from the motion and flexing distortion effects of racking forces. In the foregoing regard it should also be further noted that the self-adhering EMI/RFI insulation 88, as previously described, is employed between all connected surfaces of said knockdown EMI/RFI shielded electronic rack enclosure 10 to further enhance the EMI/RFI shielding efficiency thereof.

Considering next with respect to FIG. 2 the joining clamp 44 installation as also shown therein, which serves in this illustrative example to effect unitized joining of the bottom enclosement panel 42 to the side wall enclosement panel 36 by means of the elongated interconnecting panel bracket 92 whereby any knockdown rack enclosure 10 compromise of EMI/RFI shielding efficiency consequent from the mechanical shock forces of impact and vibration are substantially eliminated.

Thus, with the mechanical combination of squaring brackets 16 for connecting the support structure 28 corner juncture 18 horizontal and vertical frame components 20 through 26 with 34, cooperatively with the joining clamps 44 to connect side wall enclosement panels 36 with the top and bottom enclosement panels 40 and 42, in both assembly and disassembly, in the manners above described and further in combination with the interposed use of self-adhering EMI/RFI insulation 88 upon the interface of all joined surfaces, is provided the knockdown EMI/RFI shielded electronic rack enclosure 10 of instant invention.

It should be additionally noted that although the assembly connection of one of the eight corner junctures 18 of said knockdown rack 10 by means of the squaring bracket assembly 16 has been described in detail, the remaining seven corner junctures 18 are connected in a like assembly manner and in order to avoid duplicity of description they are not repetitively explained, wherein, however, opposing corners are respectively connected with right and left-hand squaring brackets 16 as will hereinafter more fully be explained on a consideration of FIG. 5. It is also to be understood that in the use of a joining clamp 44, although herein being explained in detail for the assembly connection of but one side wall enclosement panel 36 to one end of the bottom enclosement panel 42, that the three remaining such connections for top and bottom enclosement panels 40 and 42 are accomplished in a similar manner and this also being thus understood and in order to avoid further duplicity of description they likewise are not repetitively explained.

Turning attention now to a consideration of FIGS. 3 and 4, which together show further detail of corner juncture 18 joining by means of the squaring bracket assembly 16, as well as additional assembly detail in the connection of side and bottom enclosement panels 36 and 42 by means of the joining clamp 44. More clearly illustrated, in particular, are the frame contact stabilizing flanges 90 of the squaring bracket assembly 16 flanged legs 50 and 52 respectively in contact communication with the lower rear horizontal frame member 26 as shown in FIG. 4 and the vertical frame section 34 as shown in FIG. 3.

The view shown in FIG. 5 is a perspective elevation of the squaring bracket 16, with the flange 90 solid line rendition thereof being a right-handed version and the flange 90 phantom line alternate rendition thereof being a left-handed version. When assembling the support structure 28, four of the corner junctures 18 thereof as shown in FIG. 1 will be connected with right-handed squaring brackets 16, and the corresponding four opposing corner junctures 18 will be connected with left-handed squaring brackets 16, wherein the structural difference between the two squaring bracket versions is simply that of the opposing direction of projection of the leg 50 and 52 frame contact stabilizing flanges 90, which is necessary in order to accommodate opposing corner juncture 18 connections as shown in FIG. 1.

The illustration shown in FIG. 6 is an enlarged perspective view of the joining clamp 44, showing the clamp opening 72 which is dimensioned to receive in close communication contact therewithin the combined assembly of a panel flange 66 and complementary panel flange 68 with an interposed strip of self-adhering EMI/RFI insulation 88 as shown in FIG. 7. Also shown in FIGS. 6 and 7 are the self-locking nut assemblies 78, which for explanation purposes only are illustrated as three in number, but could be any plurality thereof depending upon the longitudinal dimension of said joining clamp 44. The advantage gained by use of such self-locking nut assemblies 78 is that once the corresponding plurality of threaded connectors 74 are respectively engagably assembled with the complementary self-locking nut assemblies 78 therefor, and thereafter drawn up tightly to thereby move the joining clamp side legs 94 inwardly across the clamp opening 72 towards one another and thus compressively engage the combined panel flange 66 and complementary panel flange 68 with an interposed strip of self-adhering EMI/RFI insulation 88 assembly components contained therebetween, forming a solid joining of said components with the structural integrity of a unitized construction, the conjoined assembly remains so joined and is not thereafter substantially affected by the mechanical shock forces of impact and vibration.

Dis-assembly of the knockdown EMI/RFI shielded electronic rack enclosure 10 from the erected and installed state as illustrated in FIG. 1, to the component part knocked-down and transport state is the mechanical reverse of that erection procedure as above described, that is, the joining clamps 44 and the screws 64 are removed to dis-assemble the door 12 and enclosement panels 36 through 42, and then the squaring bracket assemblies 16 are removed to dis-assemble the mechanically rigid free-standing three dimensional support structure 28.

Although the knockdown EMI/RFI shielded electronic rack enclosure invention hereof, and the structural sub-component assemblies and parts as well as the methods of employment thereof, respectively have been shown and described in what is conceived to be the most practical and preferred embodiment, it is recognized that departures may be made respectively therefrom within the scope of the invention, which is not to be limited per se to those specific details as described herein but is to be accorded the full scope of the claims so as to embrace any and all equivalent such apparatus, devices and methods.

I claim:

1. A knockdown EMI/RFI shielded electronic rack enclosure, said enclosure comprising in combination a three dimensional rectangular shaped mechanically rigid free-standing support structure comprised of a plurality of corner juncture interconnected vertical and horizontal frame members to describe a front and a rear and a pair of interconnected opposing side walls with a top and a bottom therefor, a corresponding plurality of unitary L-shaped squaring bracket assemblies each of said assemblies respectively having a horizontal flanged leg joined to a vertical flanged leg at a 90-degree angle by an interconnecting unflanged web segment for mechanically joining detachably by a nut and bolt connector means each of said plurality of corner juncture interconnected vertical and horizontal frame members describing said support structure, a door affixed by hinge means to enclosably cover the front of said support structure, a rear enclosement panel affixed by attachment means to enclosably cover the rear of said support structure, and a pair of side wall enclosement panels respectively affixed by an elongated U-shaped joining clamp adapted to slidably receive in close contact communication therewithin and compressively engage the upper and lower ends of said side wall enclosement panels respectively to a top enclosement panel end and a bottom enclosement panel end thereby to enclosably cover said pair of interconnecting opposing side walls and said top and said bottom of said support structure.

2. A knockdown EMI/RFI shielded electronic rack enclosure according to claim 1 wherein said plurality of corner juncture interconnected vertical and horizontal frame members is eight.

3. A knockdown EMI/RFI shielded electronic rack enclosure according to claim 1 wherein said horizontal flanged leg and said vertical flanged leg describe a right-handed flange projection.

4. A knockdown EMI/RFI shielded electronic rack enclosure according to claim 1 wherein said horizontal flanged leg and said vertical flanged leg described a left-handed flange projection.

5. A knockdown EMI/RFI shielded electronic rack enclosure according to claim 1 wherein said angled interconnecting unflanged web segment joins said horizontal flanged leg and said vertical flanged leg at right angles to the other by an interconnecting angle of more than 90-degrees.

6. A knockdown EMI/RFI shielded electronic rack enclosure according to claim 1 wherein all interconnected surfaces joined by said squaring bracket assembly are covered by an interposed layer of self-adhering EMI/RFI insulation.

7. A knockdown EMI/RFI shielded electronic rack enclosure according to claim 1 wherein said hinge means is a piano hinge.

8. A knockdown EMI/RFI shielded electronic rack enclosure according to claim 1 wherein said attachment means are screws.

9. A knockdown EMI/RFI shielded electronic rack enclosure according to claim 1 wherein said elongated U-shaped joining clamp is provided with a spaced set of joining clamp side legs.

10. A knockdown EMI/RFI shielded electronic rack enclosure according to claim 9 wherein said spaced set of joining clamp side legs are drawn compressively together upon said slidably received side wall enclosement panel upper end and said top enclosement panel end with said interposed layer of self-adhering EMI/RFI insulation therebetween by means of a longitudinally spaced plurality of threaded connectors insertably through and along said elongated U-shaped joining clamp threadably communicating with a complementary plurality of self-locking nut assemblies.

11. A knockdown EMI/RFI shielded electronic rack enclosure according to claim 10 wherein a layer of self-adhering EMI/RFI insulation is interposed between said side wall enclosement panel lower end and said bottom enclosement panel end.

12. A knockdown EMI/RFI shielded electronic rack enclosure according to claim 11 wherein said spaced set of joining clamp side legs are drawn compressively together upon said slidably received side wall enclosement panel lower end and said bottom enclosement panel end with said interposed layer of self-adhering EMI/RFI insulation therebetween by means of a longitudinally spaced plurality of threaded connectors insertably through and along said elongated U-shaped joining clamp threadably communicating with a complementary plurality of self-locking nut assemblies.

* * * * *